United States Patent [19]

Bloom et al.

[11] 3,954,816

[45] May 4, 1976

[54] PHOTOSENSITIVE MATERIAL COMPRISING POLYACETYLENIC AMINE SALTS

[75] Inventors: Melvin S. Bloom, Rochester; Sally S. Fico, Bergen, both of N.Y.

[73] Assignee: Eastman Kodak Company, Rochester, N.Y.

[22] Filed: Feb. 6, 1974

[21] Appl. No.: 440,229

Related U.S. Application Data

[62] Division of Ser. No. 315,249, Dec. 14, 1972, Pat. No. 3,844,791, which is a division of Ser. No. 153,059, June 14, 1971, Pat. No. 3,743,505.

[52] U.S. Cl............................. 260/404.5; 260/399; 260/404; 260/485 R; 260/501.15
[51] Int. Cl.$^2$................. C07C 87/30; C07C 87/68; C07C 91/26
[58] Field of Search.................. 260/404.5; 96/48 R, 96/88

[56] References Cited

UNITED STATES PATENTS

| 3,501,297 | 3/1970 | Cremeans | 96/88 X |
| 3,501,302 | 3/1970 | Foltz | 96/88 |
| 3,501,303 | 3/1970 | Foltz et al. | 96/88 |
| 3,501,308 | 3/1970 | Adelman | 96/88 |

*Primary Examiner*—Patrick P. Garvin
*Attorney, Agent, or Firm*—A. H. Rosenstein

[57] ABSTRACT

Amine salts of polyacetylenic compounds containing a carboxylate moiety, preferably in conjunction with a group capable of hydrogen bonding, have unusually high radiation sensitivity, and are useful radiation-sensitive components in imaging systems.

7 Claims, No Drawings

PHOTOSENSITIVE MATERIAL COMPRISING POLYACETYLENIC AMINE SALTS

This application is a division of copending application Ser. No. 315,249 filed Dec. 14, 1972 now U.S Pat. No. 3,844,791 which in turn is a division of U.S. Ser. No. 153,059 filed June 14, 1971 now U.S. Pat. No. 3,743,505.

In general, this application relates to photosensitive crystalline polyacetylenic compositions of matter. More particularly, it relates to certain crystalline radiation-sensitive polyacetylenic compounds containing at least one ammonium carboxylate moiety, and the preparation and use thereof.

Numerous polyacetylenic compositions of matter are reported in literature along with some observations of them undergoing color change upon exposure to light and/or ultraviolet radiation. Included among investigators reporting polyyne compositions are: Arthur Seher, Ferdinand Bohlmann and his coauthors; and E. R. H. Jones and M. C. Whiting and their coauthors. The photosensitive polyacetylenic compounds taught in the art contain a minimum of two acetylenic linkages as a conjugated system (i.e., -C≡C-C≡C-) and, with only a few exceptions, carbon atoms in alpha positions to the acetylenic carbon atoms, i.e., those carbon atoms directly connecting to the acetylenic carbon atoms, are bonded directly only to carbon and/or hydrogen atoms. These photosensitive polyacetylenic compositions of matter encompass diynes, triynes, tetraynes, higher polyynes and numerous derivatives and related compounds thereof various chemical classes ranging from hydrocarbon compounds to acids, esters, diols, to still other compounds of other chemical classifications containing numerous and varied organic radicals stemming from the conjugated acetylenic carbon atoms.

As is apparent from publications of the aforementioned investigators, methods are known to the art for preparation of polyacetylenic compositions. Methods also are taught in U.S. Pat. Nos. 2,816,149; 2,941,014; 3,065,283; etc. General preparative methods include: oxidative coupling or oxidative dehydrocondensation reactions of numerous terminal acetylenic compounds to prepare as desired, symmetrical and unsymmetrical polyyne compounds; dehydrohalogenation reactions to provide compounds containing actylenic bonds; and variations, modifications and combinations of such two basic reactions to provide preparative routes for a variety of polyacetylenic compositions of matter.

In addition, in U.S. Pat. No. 3,501,297, there is taught and claimed a process for photographic formation of a visual positive image through employment of crystals of an alkali metal salt of a polyacetylenicdioic acid having a minimum of two acetylenic linkages as a conjugated system. In other related patents, issuing on Mar. 17, 1970, as U.S. Pat. Nos. 3,501,303; 3,501,302; and 3,501,308, respectively, there are taught and claimed photosensitive image-receptive elements, a process for formation of a visual print-out image, a process for direct photographic formation of a visual print-out image, and radiant-energy sensitive compositions of enhanced photosensitivity and their preparation and their employment in a photographic process for direct formation of a visual image.

We have now found that radiation-sensitive polyacetylenic compounds containing at least one ammonium carboxylate moiety exhibit high sensitivity. Various polyacetylenic acids and their lower alkyl monoesters are suitable starting points from which the amine salts of this invention may be prepared. U.S. Pat. No. 3,501,297, issued Mar. 17, 1970, discloses a number of such acids, and includes citations of patents and journal articles which include exemplary and illustrative teachings of known methods for preparation of polyacetylenicpolyoic acids and their lower alkyl monoesters. For example, 9,11-eicosadiynedioic acid and 10,12-docosadiynedioic acid are reported by Black et al, J. Chem. Soc. (1953), 1787, 1790, 1791, as byproducts of coupling reactions; 9,11-eicosadiynedioic also is taught by Seher in *Fette u. Seifen*, 55 (1953), 95; and 10,12-docosadiynedioic acid also is taught by Seher in *Fette u. Seifen*, 55, (1953) 95, and in *Annalen*, 589, 222.

Exemplary of such acids and esters are 7,9-hexadecadiynedioic acid, 8,10-octadecadiynedioic acid, 9,11-eicosadecadiynedioic acid, 10,12-docosadiynedioic acid, 11-13-tetracosadiynedioic acid, 12,14-hexacosadiynedioic acid, 13,15-octacosadiynedioic acid, 14,16-triacontadiynedioic acid, 15,17-dotriacontadiynedioic acid, 15,17-tetratriacontadiynedioic acid, and 16,18-hexatriacontadiynedioic acid; and each of the monomethyl, monoethyl, and monopropyl esters thereof.

It is an object of our invention to provide novel salt derivatives of radiation-sensitive polyacetylenic compounds containing at least one carboxylic moiety. It is a further object of our invention to provide radiation-sensitive polyacetylenic compounds containing at least one ammonium carboxylate moiety. It is an additional object of our invention to provide radiation-sensitive elements containing the carboxylate salt derivatives of our invention, which elements exhibit improved radiation sensitivity.

The amine salt derivatives of this invention are those having the general formula D-$(CH_2)_x(C≡C)_n(CH_2)_y$—COO$^\ominus$A$^\oplus$ wherein, $n$ is an integer greater than 1;

$x$ and $y$ are each integers from 0 to 10;

A is selected from ammonium and substituted ammonium groups, i.e.

$NH_3R$, $NH_2RR^1$, $NHRR^1R^2$, $NRR^1R^2R^3$;

D is a hydrogen-bonding group selected from the group consisting of $CH_3$ or substituted methyl group, $COOR^4$, $CONHR^5$, $CONHNHR^6$, $CONHCONHR^6$, $R^7NHCOO$, and $R^7OOCNH$; wherein $R, R^1, R^2, R^3$ are the same or different, and may be H, alkyl of from 1 to 15 carbon atoms, substituted alkyl, or aryl.

$R^4$ may be H or lower alkyl;

$R^5$ may be an alkyl or substituted alkyl of from 3 to 10 carbon atoms, such as hydroxy, polyhydroxy, amino, substituted amino, alkylthio, or methoxy substituted alkyl;

$R^6$ may be alkyl or phenyl, and $R^7$ may be an alkyl or substituted alkyl of from 1 to 8 carbon atoms, a phenyl group, or a substituted phenyl.

Preferred amine salts are those in which D is an amide radical, particularly those containing hydroxy, carboxy, or methoxy substituted alkyl radicals. Exemplary of such moieties are — CONHCH$_2$CH$_2$CH$_2$OH,
— CONHCH$_2$CH$_2$CH$_2$COOH, and
— CONHCH$_2$CH$_2$CH$_2$OCH$_3$.

Further, preferred amine salts are those which the ammonium carboxylate moiety contains an alkyl substitution, e.g. COO$^-$N$^+$H$_3$R, wherein R is an alkyl or substituted alkyl of from 3 to 6 carbon atoms.

The preparation and utilization of the compounds may be more readily understood from the illustrative examples which follow.

Monomethyl ester of 10,12-Docosadiynedioic Acid

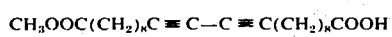

This compound is prepared by the method of U.S. 3,501,297.

EXAMPLE 1

Hexylammonium 20-(N-hexylcarbamoyl)-9,11-eicosadiyne-1-carboxylate

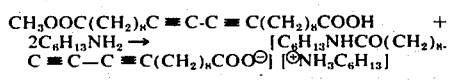

A mixture of 20.0 g. (0.053 mole, 376.59MW) of 10,12-docosadiynedioate, monomethyl ester and 30.3 g. (0.3 mole, 101.19 MW) of hexylamine is allowed to stand under nitrogen at room temperature overnight. (Alternatively, the mixture can be heated by steam bath for several hr., or 1—2 days with the same results).

The reaction causes the fluid slurry to be converted to a thick paste which is stirred with ether, and the mixture then filtered to separate unreacted starting material from the insoluble product (28 g.). The hexylammonium compound is recrystallized from 125 ml. of ethanol, chilling in an ice bath to obtain a white solid, m.p. 92°–94°C.

Calcd. for C$_{34}$H$_{62}$N$_2$O$_3$ (546.98 MW): C, 74.6; H, 11.4; N, 5.1;
Found: C, 74.8; H, 11.3; N, 5.4.

EXAMPLE 2

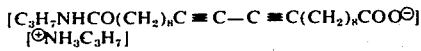

Propylammonium 20-(N-propylcarbamoyl)-9,11-eicosadiyne-1-carboxylate

A mixture of 9.4 gr. (0.025 mole, 376.59) of monomethyl ester of 10,-docosadiynedioic acid and 8.9 g. (0.15 mole, 59.11) of propylamine is kept for two days at room temperature. The pasty slurry is stirred with diethyl ether and the solid product filtered off. Recrystallization from an ethanol-ether mixture yields the pure amine.

Calcd. for C$_{28}$H$_{50}$N$_2$O$_3$: C, 72.6; H, 10.9; N, 6.1;
Found: C, 72.4; H, 10.8; N, 6.0.

EXAMPLE 3

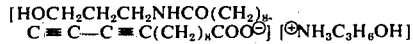

3-Hydroxypropylammonium 20-[N-(3-hydroxypropyl)carbamoyl]-9,11-eicosadiyne-1-carboxylate A mixture of 9.4 g. (0.025 mole, 376.59) of monomethyl ester of 10,12-docosadiynedioic acid and 11.3 g. (0.12 mole, 75.11) of 3-hydroxypropylamine is briefly warmed, then kept overnight at room temperature. The product is slurried with ether, then recrystallized from an ether-ethanol mixture, obtaining a white solid, m.p. 91°–3°C.

Calcd. for C$_{28}$H$_{50}$N$_2$O$_5$: C, 68.0; H, 10.2; N, 5.7;
Found: C, 68.4; H, 10.6; N, 5.7.

Amine salts of amide-substituted carboxylic acids can be prepared directly from polyynes having both carboxylic ester and carboxylic acid functions by treatment with the appropriate amine, preferably a primary aliphatic amine, but also secondary aliphatic amines and those with aromatic groups. Examples 1, 2, and 3 are illustrative of such preferred compounds.

Acid treatment of the amine salt of the amide-substituted carboxylic acid yields the amide-substituted carboxylic acid, the amine salt being destroyed. This carboxylic acid can in turn be treated with a different amine to again form an amine salt of an amide-substituted carboxylic acid. In this compound, however, the amine residue in the amine and in the amine salt are different.

These reactions are as follows:

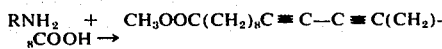
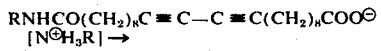
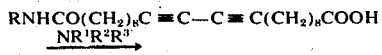

Thus, the following amines are suitable reactants for the preparation of the amine salts of the invention:
NH$_2$CH$_2$CH$_2$CH$_2$COOH
NH$_2$CH$_2$CH$_2$CH$_2$COO$^\ominus$(N$^\oplus$R$_4$)
NH$_2$CH$_2$CH$_2$NR$_2$
NH$_2$CH$_2$CH$_2$N$^\oplus$R$_3$X$^\ominus$
NH$_2$CH$_2$CH$_2$NHCH$_2$CH$_2$OH
NH$_2$C(CH$_2$OH)$_3$
NH$_2$C(CH$_3$)(CH$_2$OH)$_2$
NH$_2$CHOHCH$_2$N(C$_2$H$_5$)$_2$
NH$_2$CHOHCH$_2$OH
NH$_2$CH$_2$CH$_2$CH$_2$SO$_3$Na
NH$_2$CH$_2$CH$_2$CH$_2$N(CH$_2$CH$_2$OH)$_2$.

Following the process set forth in the preceding examples, the following amine salts are prepared:

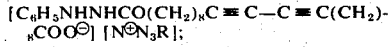
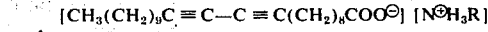
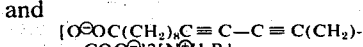

wherein R is selected from the group consisting of $CH_3$, $C_2H_5$, $C_3H_7$, $C_4H_9$, $C_5H_{11}$, $C_6H_{13}$, $C_3H_6OH$, $C_3H_6OCH_3$, $C_3H_6COOH$, $C_6H_5$, $C(CH_2OH)_3$, $CHOHCH_2N(C_2H_5)_2$, and $CHOHCH_2OH$.

Each crystalline polyacetylenic compound for which a specific example of preparation already has been presented herein is photosensitive in that upon exposure to as least one form of radiant energy, particularly ultraviolet radiation, it will underto a visible color change. A semiquantitive determination and comparison of the photosensitive response of various prepared crystalline polyacetylenic compounds of the specific examples can be made as follows: The polyacetylenic compound in an organic solvent is flowed onto a white surface, such as that of a white filter paper of white filing card, and solvent evaporated to leave an adhered deposit of the crystalline polyacetylenic compound. The deposited crystalline polyyne compound then is exposed to radiant energy in the ultraviolet range, and the density of the colored photoproduct measured.

Radiant energy, as used herein in regard to the crystalline polyacetylenic compositions, is intended to include numerous variant forms of radiant energy encompassing not only the ultraviolet and visible regions (i.e., actinic radiation) and infrared region of the electromagnetic spectrum, but also electron beam radiation such as is developed by cathode ray guns, also gamma rays, X-rays, beta rays, electrical corona discharge, and other forms of corpuscular and/or wavelike energy generally deemed to be radiant energy. The various individual crystalline polyacetylenic compositions disclosed are not responsive to all forms of radiant energy, but selectively respond to at least one or more of the several variant forms of radiant energy.

In the practice of the invention there is employed a photo-sensitive image-receptive element comprising a carrier means which serves to position fixedly crystals of the photosensitive crystalline polyacetylenic composition of matter. The carrier means functions to hold individual crystals in fixed position in relation to other crystals so that the element, whether unexposed and exposed, can be handled and moved without displacement or change in positions of crystals with respect to each other. Thus, the element can be moved, rotated, turned over, lifted, and subjected to like physical handling, and because of the carrier means as a component thereof, be of practical utility for many diverse image-recording applications. In contrast, were a carrier means not included as a component of the imagereceptive element, as if one were to use a loose mass of layer of photosensitive crystals, then almost any slight movement of the exposed element, and even a slight air current, could disturb and displace crystals from their original position with a resultant image on the exposed element becoming distorted and deformed and not a true image. Such an element devoid of carrier means would lack any substantial practical utility for image-recording purposes.

The carrier means can be in any of several diverse embodiments so long as it functions to hold individual crystals substantially in fixed position in relation to other crystals. Generally and preferably the carrier means comprise a binder material, such as a natural or synthetic plastic, resin, colloid or gel and the like wherein the crystals of the photosensitive crystalline polyacetylenic compositions of matter are dispersed therein and held in fixed position thereby. In such instances the polyyne composition is mixed as a dope, solution, emulsion, dispersion or the like with the binder material and then processed to provide solid films, sheets, coatings and the like containing dispersed crystals of the photosensitive crystalline polyacetylenic composition of matter. Thus, one embodiment of the image-receptive element is a solid sheet, film or the like comprising a binder material as a dispersing medium to position fixedly therein dispersed crystals of the photosensitive crystalline polyacetylenic composition. Another embodiment of the element is a substrate material or body to which adheres a film, coating, or the like of the binder material having the dispersed crystals therein. Useful substrate materials include paper sheet, glass sheet, plastic film, and other conventional and suitable photographic quality substrate materials. Still an additional embodiment of the element can comprise the substrate material having adhered thereto a binder-free coating of crystals of the photosensitive crystalline polyacetylenic composition of matter. Other element embodiments, as desired, can include a coating of a suitable quality photographic coating material on one or more surfaces and interfaces of the various element embodiments. In addition other element embodiments can comprise the polyyne crystals and a support means of any of various combinations of the several foregoing components and still other components apparent to those in the art, so long as the carrier means fixedly positions the photosensitive crystalline polyacetylenic composition.

Exemplary substrate materials of utility as components for the carrier means include: vitreous materials, such as glass, glazed ceramics, porcelain, etc.; fibrous materials, such as cardboard fiberboard, paper including bond paper, resin and clay-sized papers, wax or other transparentized paper, paperboard, etc., cloths and fabrics including those of silk, cotton, viscose rayon, etc.; metals, such as copper, bronze, aluminum, tin, etc.; natural polymers and colloids such as gelatin, polysaccharides; natural and synthetic waxes including paraffin, beeswax, carnauba wax; synthetic resins and plastics, including particularly polyethylene, polypropylene, polymers and copolymers of vinylidene and vinyl monomers including polyvinyl chloride, polyvinylidene chlordie, vinyl chloride/vinyl acetate, vinyl acetate/acrylate, vinyl acetate/methacrylate, vinylidene chloride/acrylonitrile, vinylidene chloride, vinyl acetate, vinylidene chloride/methacrylate, polystyrenes, polyvinyl acetals including polyvinyl butyral, polyvinyl formal, polyvinyl alcohol, polyamides including polyhexamethylene adipamides, N-methoxymethyl polyhexamethylene adipamide, natural and synthetic rubbers including butadiene-acrylonitrile copolymers, 2-chloro-1,3-butadiene polymers, polyacrylate polymers and copolymers including polymethylmethacrylate, polyethylmethacrylate, polyurethanes, polycarbonates, polyethylene terephthalate, polyethylene terephthalate/isophthalate copolymers and other esters as by condensing terephthalic acid and its derivatives with propylene glycol, diethylene glycol, tetramethylene glycol or cyclohexane-1,4-dimethanol, cellulose ethers including methyl cellulose, ethyl cellulose and benzyl cellulose, cellulose esters and mixed esters including cellulose acetate, cellulose triacetate, cellulose propionate, cellulose nitrate and cellulose diacetate; and even nonthermoplastic materials including cellulose phenolic resins, melamine-formaldehyde resins, alkyd resins, thermosetting acrylic resins, epoxy resins, and numerous other synthetic resins and plastics as will be apparent to those skilled in the art.

The base or substrate material may be transparent, translucent or opaque to the particular radiant energy to which the employed photosensitive crystalline polyacetylene compound is sensitive. It is selected with due consideration of the intended usage of the imaged element and of the specific radiant energy and technique to the employed in the particular image-recording application. For example, where the imaging technique requires transmission of ultraviolet radiant energy through the substrate material to expose the polyacetylenic crystals, the substrate should possess such a transmission characteristic and may be a cellulose acetate butyrate, cellulose acetate, polyvinyl alcohol, polyvinyl butyral or other suitable transparency. The base or substrate material may be adhered directly to the binder-free or binder-dispersed photosensitive crystals, or indirectly adhered, if desired, by a subbing layer or coating on the substrate material for any of several purposes, e.g., to alter the substrate transmission of the radiant energy, to change the substrate's reflectivity of the radiant energy, to modify adherence to the substrate material and for other reasons. Similar to the base or substrate material, such subbing layer is selected with due regard to the specific radiant energy and technique to be employed in the particular image-recording application. Subbing layers for various photographic purposes and methods of coating substrate materials with the same are well known.

Generally and preferably the element, whether comprised of binder-dispersed crystals or comprised of substrate material and binder-free crystals or binder-dispersed crystals, is a flat film, sheet, plate or the like so as to present a flat surface upon which radiant energy may be directed. However, curved-surfaced and other than flat-surfaced elements, although generally of lesses utility, are not excluded.

Exemplary binder materials of utility as components for the carrier means include: natural and synthetic plastics, resins, waxes, colloids, gel and the like including gelatins, desirably photographic-grade gelatin, various polysaccharides including dextran, dextrin, hydrophyllic cellulose ethers and esters, acetylated starches, natural and synthetic waxes including paraffin, beeswax, polymers of acrylic and methacrylic esters and amides, hydrolyzed interpolymers of vinyl acetate and unsaturated addition polymerizable compounds such as maleic anhydride, acrylic and methyacrylic esters and styrene, vinyl acetate polymers and copolymers and their derivatives including completely and partially hydrolyzed products thereof, polyvinyl acetate, polyvinyl alcohol, polyethylene oxide polymers, polyvinylpyrrolidine, polyvinyl acetals including polyvinyl acetaldehyde acetal, polyvinyl butyraldehyde acetal, polyvinyl sodium-o-sulfobenzaldehyde acetal, polyvinyl formaldehyde acetal, and numerous other known photographic binder materials including a substantial number of aforelisted useful plastic and resinous substrate materials which are capable of being placed in the form of a dope, solution, dispersion, gel, or the like for incorporation therein of the photosensitive polyacetylenic composition and then capable of processing to a solid form containing dispersed crystals of the photosensitive crystalline polyacetylenic composition of matter. As is well known in the art in the preparation of smooth uniform continuous coatings of binder materials, there may be employed therewith small amounts of such conventional coating aids as viscosity controlling agents, leveling agents, dispersing agents, and the like. The particular binder material employed is selected with due regard to the specific radiant energy and technique to be employed in the particular image-recording application and invariably is a binder material permitting substantial transmission of that specific radiant energy to be employed. Desirably, the binder material is a nonsolvent, or possesses only limited solvating properties, for the photosensitive polyyne so that the polyyne is capable of existence in its crystalline form therein.

Well-known sources, lenses, and optical systems, camera arrangements, focusing and projection systems and the like for the various forms of radiant energy are used in employing the image-receptive element in the varied image-forming applications, such as specimen photography, pattern making, reproduction of written, printed, drawn, typed, and like matter, and the recording of line graphical images by an impinging pointed beam of the radiant energy on the element with either or both the element and pointed beam guided or traveling to trace the image. The resultant images are directly formed print-out images in that they can be seen by the human eye to be a visibly distinctly different color than unirradiated crystals of the element.

The photosensitive image-receptive element may be used in image-forming systems based on transmission-exposure techniques and reflex-exposure techniques. Thus, stencils of a material substantially nontransmissive of the radiant energy may be laid on the image-forming element with the cutout portion of the stencil allowing the applied radiant energy to strike the element according to the desired image or images. If desired, the stencil need not contact the element with the radiant energy being projected to pass through the cut-out portion of the stencil to strike the element. The element also can be exposed by contact or projection techniques through a two-tone image or process transparency, i.e., a process negative or positive (i.e. an image-bearing transparency consisting of areas transmissive and opaque to the radiant energy such as of a so-called line of halftone negative or positive-type transparency) or a continuous tone negative or positive. Likewise an object, whose image is to be obtained, may be placed between the radiant energy source and the element and the radiant energy striking the element will be of an image pattern dependent on the radiant energy absorption and transmission characteristics of the particular object. Reflex-exposure techniques are applicable. For example, the ultraviolet reflecting optic techniques, the ultraviolet sensitive image-receptive elements may be used to make photocopies of printed or typed copy. Reflexexposure techniques are particularly useful for making office copies from materials having messages on both sides of a page, for making images of specimens and objects, and for reproducing messages and the like found on materials not having radiant energy transmissive properties conducive to transmissionexposure techniques.

Where the image elements are to be retained for lengthy periods, they are stored, as in an envelope or opaque container, in a manner excluding any stray irradiation of radiant energy of a form photosensitively effecting the element. This may be effectively accomplished by overcoating the imaged element with a layer of material which absorbs radiation to which the element is photosensitive. Thus, an ultraviolet absorbing layer may be coated over the imaged element. Alternatively, the initially imaged elements may be fixed or converted to a more stable image state. In fixing, the unexposed photosensitive crystalline polyyne is placed in a form where-at it is no longer substantially photosensitive, as by solvating it in the binder, changing it from crystalline to liquid state, or washing it out from the element, and the like. In conversion, the initial irradiation induced color is transformed to another distinctly different color, which is relatively stable as to exposure to the initial form of radiant energy inducing the image formation.

A particularly convenient manner to effect a color transformation of the initially induced image is to carfully heat the imaged element to an appropriate elevated temperature, generally between 5°–20°C. less than the melting point of the nonirradiated crystalline photosensitive polyyne, where-at the initial radiant-energy induced colortransformer crystals and crystal portions transform to another distinctly different visible color. Temperatures approximating and higher than the melting point of the nonirradiated photosensitive crystalline polyyne will effect a color transformation of the initial radiant-energy induced colored polyyne crystals, but in so doing, there may be some loss in sharpness of the image with some blurring and roughing of the image border or periphery. This can be avoided, or at least minimized, if the colored imaged crystal portions and crystals are firmly held at these temperatures in position by the binder and if the imaged crystals are so held as to avoid being overcoated or dissolved in melted unexposed polyyne.

Another manner for effecting color transformation of the blue-colored image is exposure to a solvent for the unexposed polyyne. An exposure for about 10 to 15 seconds at an elevated temperature from about 5° to 10°C. lower than employable for heat fixing generally is satisfactory. Methanol, ethanol, toluene, diethyl ether, butyl acetate, carbon tetrachloride, acetone, 2-butoxyethanol, and like solvents are useful and water vapor and aqueous solutions, such as aqueous hydrochloric acid with water soluble polyyne derivatives. Other useful solvents also will be apparent.

An advantage of the element, having the image thereof in another distinctly different color than the radiation-induced colored image, is that this other color may be more susceptible to providing copies with good contrast when prints, negatives, and the like of this image are made by conventional silver halide photographic techniques.

As indicated above, image recording elements utilizing radiation sensitive polyynes are prepared by fixing the crystalline polyyne on a surface. This may be done, for example, by coating a dispersion of the polyyne in a polymer matrix on a suitable support, or by coating a solution of the polyyne in a polymer solution and allowing the polyyne to crystallize upon solvent evaporation, or by applying a solution of a polyyne to a paper surface and allowing the polyyne to crystallize upon the fibers, or by coating a dispersion of a water immiscible polyyne solution in an aqueous binder and allowing evaporation to form polyyne crystals in the binder matrix.

EXAMPLE 4

584 mg of hexylammonium 20-(N-hexylcarbamoyl)-9,11-eicosadiyne-1-carboxylate;

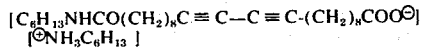

is dissolved in 1.5 ml of cyclohexanone. This solution is filtered and added to a formulation containing 4.0 ml of a 12% aqueous gelatin solution, 0.5 ml. of a 10% alcohol-water (50:50) solution of Alkanol XC (a DuPont wetting agent reported to be a sodium alkylnaphthalene sulfonate) and 4.5 ml of distilled water. This mixture is dispersed for 60 seconds with a Branson Ultra-Sonic probe (185 WE, ½ inch tip) at maximum intensity. The non-crystalline dispersion is then coated with a 0.004 inch coating blade on a poly (ethylene terephthalate) film containing a vinylidene chloride (80%)-acrylonitrile (14%)-acrylic acid (6%) terpolymer subbing layer overcoated with a cuprous iodide-cellulose nitrate conductive layer of the type described in Trevoy, U.S. Pat. No. 3,245,833. The coating is chill-set and allowed to dry at room temperature. Electron micrographic show a crystal size range of from about < 0.2 to about 4.0 microns with an average particle size in the coating of about 0.8 microns.

Similar coatings are prepared utilizing the monomethyl ester of 10,12-docosadiynedioic acid as a control, and the compounds of Examples 2 and 3. The dispersion solvent utilized for these materials is as follows:

monomethyl ester of 10,12-docosadiynedioic acid — Ethyl acetate
Polyyne of Example 2 above — Ethyl acetate — cyclohexanone (2:1)
Polyyne of Example 3 above — chloroform These coatings are tested as described to yield the following results;

|  | Polyyne | Relative Speed |
|---|---|---|
| Control - | $CH_3OOC(CH_2)_8C \equiv C—C \equiv C(CH_2)_8COOH$ | 100 |
| Example 1 - | $[C_6H_{13}NHCO(CH_2)_8C \equiv C—C \equiv C(CH_2)_8COO^\ominus]$ $[N^\oplus H_3C_6H_{13}]$ | 2040 |
| Example 2 - | $[C_3H_7NHCO(CH_2)_8C \equiv C—C \equiv C(CH_2)_8COO^\ominus]$ $[N^\oplus H_3C_3H_7]$ | 812 |
| Example 3 - | $[HOCH_2CH_2CH_2NHCO(CH_2)_8C \equiv C—C \equiv C(CH_2)_8COO^\ominus]$ $[N^\oplus H_3C_3H_6OH]$ | 162 |

The coatings, prepared as above, are tested exposing them to a Mineralite UVS-12 ultraviolet lamp. Relative speed is calculated according to the formula:

$$\text{Relative Speed} = \frac{10^3}{T},$$

where $T$ = time in seconds required to develop a density of 1.0 under given exposure conditions. The control is arbitrarily assigned a value of 100 to establish a simple basis for direct comparison.

The invention has been described in detail with particular reference to preferred embodiments thereof, but, it will be understood that variations and modifications can be effected within the spirit and scope of the

We claim:
1. Radiation-sensitive crystalline polyacetylenic amine salts having the structural formula:

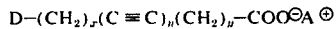

wherein:
  $n$ is an integer greater than 1;
  $x$ and $y$ are each an integer from 0 to 10;
  $A$ is $NRR^1R^2R^3$ wherein R, $R^1$, $R^2$, and $R^3$ are H, alkyl of from 1 to 10 carbon atoms, aryl or substituted alkyl having substituents chosen from the group consisting of hydroxy, amino, carboxy and methoxy substituents;
  D is selected from the group consisting of $CONHR^5$, $CONHNHR^6$, and $R^7NHCOO$ radicals, wherein
  $R^5$ is an alkyl or substituted alkyl of from 3 to 8 carbon atoms in which the substituents are chosen from the group consisting of hydroxy, amino, and methoxy substituents,
  $R^6$ is alkyl or phenyl, and
  $R^7$ is an alkyl of from 1 to 8 carbons or phenyl.
2. A polyacetylenic amine salt as set forth in claim 1, wherein i n is 2, $x$ and $y$ are each 8 and D is a substituted alkylamide radical.
3. A polyacetylenic amine salt as set forth in claim 1 wherein A is $NH_3R$, wherein R is an alkyl radical of from 3 to 6 carbon atoms.
4. A polyacetylenic amine salt as set forth in claim 1 wherein A is $NH_3R$, wherein R is a hydroxy substituted alkyl of from 3 to 6 carbon atoms.
5. A polyacetylenic amine salt as set forth in claim 1 wherein said amine salt is hexylammonium 20-(N-hexylcarbamoyl)-9,11-eicosadiyne-1-carboxylate.
6. A polyacetylenic amine salt as set forth in claim 1 wherein said amine salt is propylammonium 20-(N-propylcarbamoyl)-9,11-eicosadiyne-1-carboxylate.
7. A polyacetylenic amine salt as set forth in claim 1 wherein said amine salt is 3-hydroxypropylammonium 20-9,11-eicosadiyne-1-carboxylate.

* * * * *

UNITED STATES PATENT AND TRADEMARK OFFICE
CERTIFICATE OF CORRECTION

PATENT NO. : 3,954,816
DATED : May 4, 1976
INVENTOR(S) : Melvin S. Bloom and Sally S. Fico It is certified that error appears in the above-identified patent and that said Letters Patent are hereby corrected as shown below:

Column 12, line 4, before "n", delete "i".

Column 12, line 21, "20-9,11" should read --- 20-[N-(3-hydroxypropyl)—carbamoyl]—9,11 --.

Signed and Sealed this

Twenty-eighth Day of December 1976

[SEAL]

Attest:

RUTH C. MASON
Attesting Officer

C. MARSHALL DANN
Commissioner of Patents and Trademarks